United States Patent
Bona et al.

(10) Patent No.: US 6,792,173 B2
(45) Date of Patent: Sep. 14, 2004

(54) DEVICE AND METHOD FOR SWITCHING OPTICAL SIGNALS

(75) Inventors: Gian-Luca Bona, Hedingen (CH); Michel Despont, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 10/145,219

(22) Filed: May 13, 2002

(65) Prior Publication Data

US 2002/0191893 A1 Dec. 19, 2002

(30) Foreign Application Priority Data

May 16, 2001 (EP) ............................................ 01810489

(51) Int. Cl.⁷ .............................................. G02B 6/35
(52) U.S. Cl. .............................. 385/16; 385/15; 385/17
(58) Field of Search .............................. 385/15, 16, 17, 385/18, 19, 20, 21, 22, 23, 31, 39, 41, 42, 47, 73; 348/197; 398/43, 82

(56) References Cited

U.S. PATENT DOCUMENTS

| | | | |
|---|---|---|---|
| 6,002,818 A | * 12/1999 | Fatehi et al. ................... | 385/17 |
| 6,134,207 A | * 10/2000 | Jerman et al. .......... | 369/112.29 |
| 6,166,890 A | 12/2000 | Stefansky et al. ....... | 360/294.4 |
| 6,385,364 B1 | * 5/2002 | Abushagur .................... | 385/16 |
| 6,522,802 B2 | * 2/2003 | Hoen ........................... | 385/18 |
| 2003/0185497 A1 | * 10/2003 | Zhou ............................ | 385/22 |
| 2003/0185498 A1 | * 10/2003 | Zhou ............................ | 385/22 |
| 2003/0202741 A1 | * 10/2003 | Abushagur .................... | 385/24 |

FOREIGN PATENT DOCUMENTS

| | | |
|---|---|---|
| EP | 1 039 325 A2 | 4/2000 |
| JP | 10-327590 | 5/1997 |
| WO | WO 99/37013 | 7/1999 |
| WO | WO 00/67063 | 11/2000 |
| WO | WO 00/79311 A2 | 12/2000 |

OTHER PUBLICATIONS

Jerry D. Gibson, The Communizations Handbook, CRC Press, Boca Raton 1997, Chapter 37, pp. 513–528 and p. 734 and Ch. 58, pp. 789–793, Ch. 60.7, p. 828, and Ch. 65.5 pp. 888–889.

Saleh, Teich, Fundamentals of Photonics, A Wiley–Interscience Publication, p. 856, 1991.

* cited by examiner

*Primary Examiner*—John D. Lee
*Assistant Examiner*—James P. Hughes
(74) *Attorney, Agent, or Firm*—Wan Yee Cheung

(57) ABSTRACT

Described is a device for directing an optical signal from a first optical fiber (101, 102, . . . ) along one of a plurality of selectable switching paths each terminating in a corresponding one of a plurality of second optical fibers (401, 402, . . . ) via an optical element (201, 202, . . . ), the optical element (201, 202, . . . ) being moveable by a controllable actuator (60) from a first to a second position to change the switching path of incident optical signal. The optical element (201, 202, . . . ) is slideably mounted in parallel to a first mounting plate (10) comprising a conduit (11) through which the optical signals from the first optical fiber (101, 102, . . . ) can be directed by the optical element (201, 202, . . . ) along the selected one of the switching paths to one of a plurality of conduits (21) in a second mounting plate (20) parallel to the first mounting plate (10), and further to the corresponding one of second optical fibers (401, 402, . . . ).

17 Claims, 6 Drawing Sheets

DEVICE AND METHOD FOR SWITCHING OPTICAL SIGNALS

FIELD OF THE INVENTION

The present invention generally relates to a device and a method for switching optical signals and particularly relates to an optical switch for selectively establishing pathways for light beams which enter and leave the optical switch through conduits which are distributed over two parallel planes thus allowing the selective direction of a light beam in three dimensions from an incoming to an outgoing optical fibre.

BACKGROUND OF THE INVENTION

According to Jerry D. Gibson, *THE COMMUNICATIONS HANDBOOK*, CRC PRESS, Boca Raton 1997, chapter 37, pages 513–528 the migration of photonics into switching is occurring in a variety of ways. This is happening because of the large variety of switching tasks to be performed in a modern communications network. The different switching tasks range from ensuring that major trunks have the ability to be switched from one route to another when a catastrophic accident destroys a route, to the real-time switching on a per call basis. Two generic switching applications that are in use in present networks are protection switching and call-by-call switching. Both of these applications will preferably be realised in the future with optical switching techniques.

Most of the switches currently in use require conversion of the optical signals received through optical fibers into electrical signals which are routed for example in an electronic switching fabric from an incoming line to an output line which is selected according to the corresponding signalling information. Electronic switching fabrics are described in the aforementioned Gibson reference, chapter 32, pages 425–432.

A fiber optic communications network typically operates at data rates from a few megabit per second to beyond 2.5 Gb/s. At the 2.5 Gb/s rate, several thousand digitised voice channels, each operating at 64 kb/s, can be transmitted along a single fiber using time-division multiplexing. Electronic switching fabrics which can handle the traffic in fiber telephone networks require therefore transfer capacities which are costly to realise. Electronic switching fabrics in fiber optic communications networks will therefore be replaced in the near future by optical switches acting as cross-connects which allow the bit transparent data transfer between data systems such as public telephone exchanges.

An optical switch for the transparent transfer of data is described for example in PCT Patent Application publication number WO 00/79311. This optical switch comprises, mounted on a base, at least one controllable actuator used for positioning of an optical element designed to guide an optical signal on a selected free space switching path, within an optical path plane arranged parallel to said base, from an input optical fiber to an output optical fiber. Switching therefore takes place in two dimensions over the optical path plane along which on two sides opposite to each other optical fibers are arranged in rows. The size of the optical path plane and therefore of the optical switch rapidly increases with the number of optical fibers installed. Further the lengths of the switching paths also increase so that the optical elements require a more precise adjustment. The mounting and precise alignment of each of the optical elements, mounted perpendicular to respective upright on the base and parallel to opposing optical elements by means of hinges and a carrier panel, results in corresponding production costs. Imprecise alignment may however cause transmission losses. It would therefore be desirable to improve the described optical switch. It would be desirable in particular to provide an optical switch of smaller size while allowing the connection of an increased number of optical fibres for switching purposes. It would further be desirable to design an optical switch which can be manufactured at reduced cost. Further, it would be desirable to design an optical switch which easily allows correct geometrical positioning of the optical elements and therefore avoids adjustment problems. It would also be desirable to provide an optical switch comprising simple means for precisely aligning selected optical paths between optical fibers. It is further desirable to provide a method for establishing, optimising and correctly maintaining established optical paths between optical fibers.

SUMMARY OF THE INVENTION

In accordance with the present invention, there is now provided a device for directing an optical signal from a first optical fiber along one of a plurality of selectable switching paths each terminating in a corresponding one of a plurality of second optical fibers via an optical element, the optical element being moveable by a controllable actuator (60) from a first to a second position to change the switching path of incident optical signal, characterised in that the optical element is slideably mounted in parallel to a first mounting plate comprising a conduit through which the optical signals from the first optical fiber can be directed by the optical element along the selected one of the switching paths to one of a plurality of conduits in a second mounting plate parallel to the first mounting plate, and further to the corresponding one of second optical fibers.

In a preferred embodiment of the present invention, the first mounting plate comprises a plurality of conduits each for communicating optical signals with a corresponding one of a plurality of first optical fibers and each corresponding to a different one of a plurality of optical elements slideably mounted in parallel to the first mounting plate for selectively directing optical signals passing through the corresponding conduit.

Optical elements may be mounted in parallel to the second mounting plate for adapting an optical signal arriving over the switching path to the second optical fibers. The optical elements mounted in parallel to the second mounting plate may be slideably moveable relative to the conduits in the second mounting plate for directing optical signals arriving from the second optical fibers to the optical elements of the first mounting plate and further to the first optical fibers.

Each of the slideable optical elements is preferably coupled to an actuator subsystem for sliding the optical elements between different positions within a plane. The actuator subsystem preferably moves the slideable optical elements based on forces generated by any one or more of piezoelectric, electrostatic, acoustic and thermal effects.

The actuator subsystem may hold the slideable optical elements in position by friction. Each slideable optical element preferably comprises a flat part which is supported by the actuator subsystem and at least one of a reflective part and a refractive part. The reflective part may comprise a mirror and the refractive part may comprise a lens.

In a particularly preferred embodiment of the present invention, the actuator subsystem and light sensitive elements are arranged near the conduits of the first and/or the second mounting plate and are connected to a control unit which adjusts the position of the slideable optical elements such that signals caused in the light sensitive elements by improper alignment of optical signals are reduced to a minimum. Two or more light sensitive elements are preferably placed at regular distances on a circle concentric to a conduit. The slideable optical elements are preferably designed to provide optical signals with a main lobe and at least one side lobe which is directed toward a light sensitive element. The control unit may sense data carried by the signals received from the light sensitive elements.

The slideable optical elements may be designed to have a fan-out of at least two optical beams which are guided along different switching paths. The slideable optical elements are preferably mounted between the corresponding mounting plate and a holding plate comprising apertures for the passage of optical signals.

The first and second mounting plates may be connected to each other by spacers or side-walls.

Viewing the present invention from another aspect, there is now provided a method for switching an optical signal from a first optical fiber along one of a plurality of selectable switching paths each terminating in a corresponding one of a plurality of second optical fibers via an optical element, the optical element being moveable by a controllable actuator from a first to a second position to change the switching path of incident optical signal, characterised in that the method comprises: slideably mounting an optical element in parallel to a first mounting plate comprising a conduit; and directing the optical signals from the first optical fiber through the conduit by the optical element along the selected one of the switching paths to one of a plurality of conduits in a second mounting plate parallel to the first mounting plate, and further to the corresponding one of second optical fibers.

In a preferred embodiment of the present invention to be described shortly, optical signals are passed from a first optical fiber, directed by an optical element along a selectable switching path, to a second optical fiber. The optical element is moveable by a controllable actuator from a first to a second position in order to change the switching paths of incident optical signals. The optical elements are slideably mounted in parallel to a first mounting plate comprising conduits through which the optical signals from the first optical fiber can be directed by the optical elements to the second optical fiber via conduits in a second mounting plate aligned in parallel to the first mounting plate. Preferably, optical elements are also mounted slideable in parallel to the second mounting plate in order to direct optical signals arriving from the second optical fibers to the optical elements of the first mounting plate and further to the first optical fibers. Each of the slideable optical elements is coupled to an actuator or actuating elements capable to slide the optical elements between different positions within a plane in parallel to the corresponding mounting plate in order to establish a selectable switching path. This therefore allows switching of optical signals bi-directionally in three dimensions between optical fibers having access points on the device which are distributed in two dimensions on a first and a second mounting plate. The resulting switching paths enclosed between the two mounting plates which are installed in parallel to each other can therefore be kept at small size while switching the optical signals of numerous fibers. At the same time the deflection angles on the switching paths can be kept low which ensures fast and precise switching. At the same time beam aberration, particularly beam broadening, while passing along the switching path, is minimised.

Besides improved capabilities and functionalities, devices embodying the present invention provide advantages in the production processes. Specifically, devices embodying the present invention can be produced in parallel layers, which reduces production time and alignment efforts. The optical elements are slideable in parallel to the mounting plates without the use of panels and hinges which may be of reduced stability. The aforementioned actuators for devices embodying the present invention which move the slideable optical elements allow a precise positioning of the optical elements which then can be securely held by friction in a selected position until the switching path is changed again. As mentioned earlier, the slideable optical elements may comprise a reflective and a refractive part such as a mirror and a lens respectively so that the operational mode of the device can be changed between transmission and reflection. Also, as mentioned earlier, light sensitive elements may be arranged near the conduits of the first and/or the second mounting plate through which the optical signals are guided in order to establish and adjust the switching paths. Misalignments of the switching paths can therefore be detected and corrected by means of a control unit which adjusts and optimises the position of the optical elements by feedback.

BRIEF DESCRIPTION OF THE DRAWINGS

Preferred embodiments of he present invention will now be described, by way of example only, with reference to the accompanying drawings, in which.

DETAILED DESCRIPTION OF THE PREFERRED EMBODIMENTS

Figure 1:
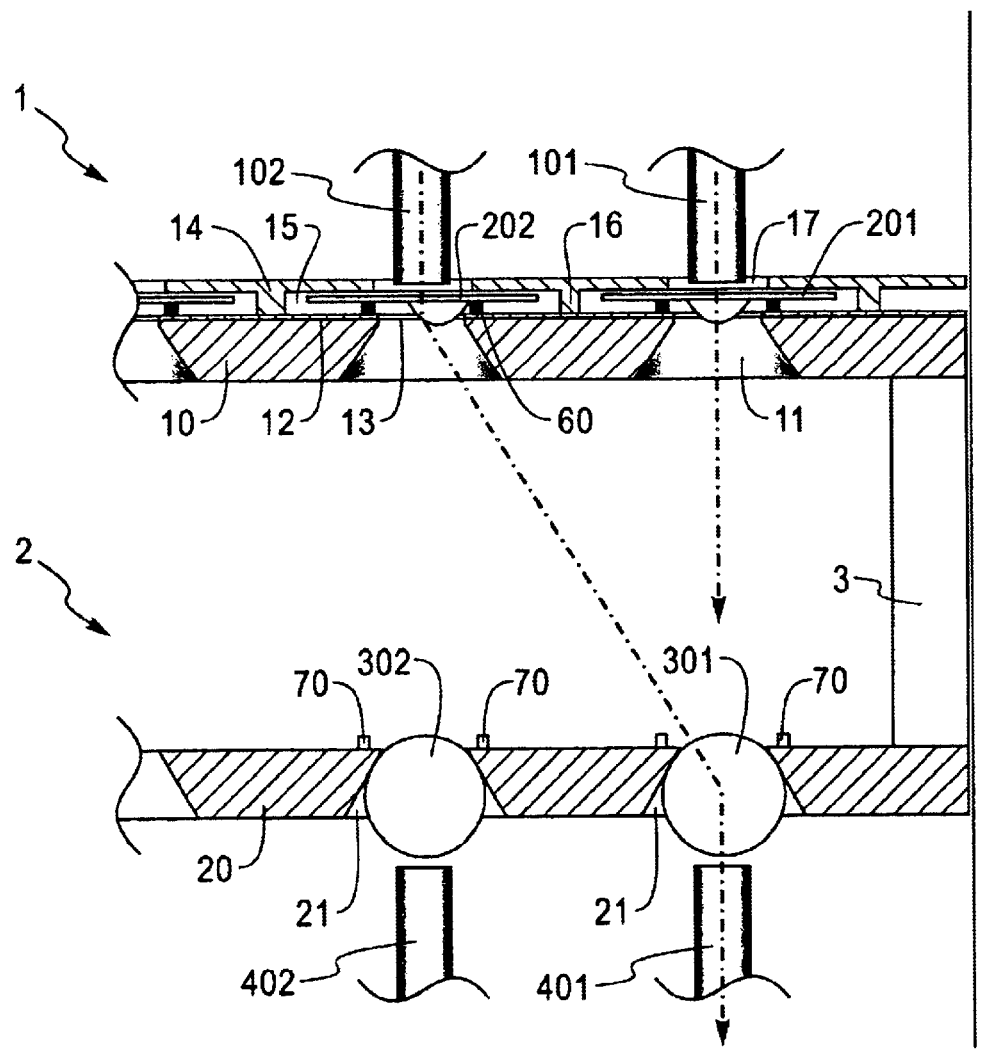
FIG. 1 is a side view of an example device embodying the present invention with slideable optical elements installed on a first mounting plate.

FIG. 1 is a side view of an optical switching device embodying the present invention with slideable optical elements 201, 202, . . . installed on a mounting plate 10. The device is designed to switch optical signals passing from a set of first optical fibers 101, 102, . . . directed by the slideable optical elements 201, 202, . . . along selectable switching paths to optical elements 301, 302, . . . installed on a second mounting plate 20 and further to a set of second optical fibers 401, 402, . . . .

The optical elements 201, 202, . . . are slideably mounted in a plane aligned in parallel to the first mounting plate 10. The optical elements 201, 202, . . . are disposed between the first mounting plate 10 and a parallel holding plate 14. The first mounting plate 10 and the holding plate 14 comprise conduits 11 and 17 respectively through which the optical signals from the first optical fibers 101, 102, . . . can be directed by the slideable optical elements 201, 202, . . . to the optical elements 301, 302 installed in conduits 21 of the second mounting plate 20 disposed in parallel to the first mounting plate 10.

The slideable optical elements 201, 202, . . . can be selectively moved by addressable actuators 60 from a first to a second position to change the switching paths of incident optical signals.

The holding plate 14 comprises lateral extensions 16 connecting to the first mounting plate 10 by means of an adhesive layer 12 having apertures 13 aligned co-axially to the conduits 11, 17 of the first mounting plate 10 and the holding plate 14. The extensions 16, the holding plate 14 and the first mounting plate 10 form plane chambers 15 each for receiving an optical element 201, 202, . . . and for permitting limited sliding movement of the received optical element 201, 202, . . . within a plane aligned in parallel to the first mounting plate 10.

The device shown in FIG. 1 further comprises light sensitive elements 70, which are arranged close to the conduits 21 of the second mounting plate 20 in such a way that the light sensitive elements 70 receive a part of the optical signal during inaccurate alignment of a switching path. Four light sensitive elements 70 are placed in regular distances on a circle concentric to each conduit 21.

Figure 2:
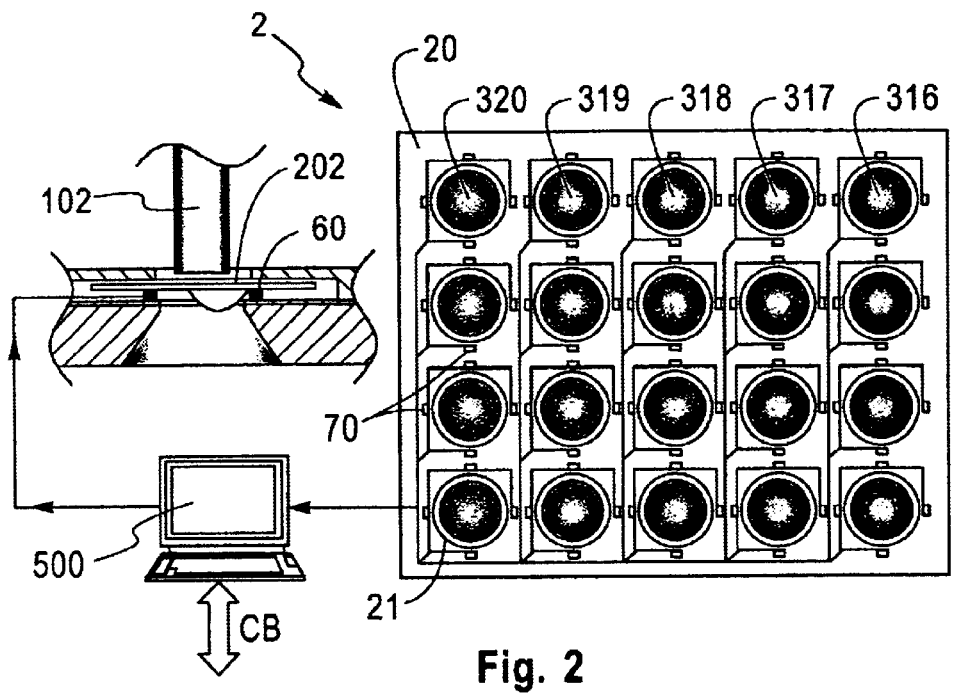
FIG. 2 shows a control unit connected to actuators on the first mounting plate and light sensitive elements on a second mounting plate.

As shown in FIG. 2 the light sensitive elements 70 can be connected to a control unit 500 for adjusting the position of the slideable optical elements 201, 202, . . . to maximise coupling of optical energy to the outgoing optical fiber. This can be achieved by minimising the signals received from the light sensitive elements 70 or by monitoring the signals received from the light sensitive elements 70 while iteratively displacing the slideable optical elements 201, 202, . . . until a known optimal position can be reached.

Figure 3:
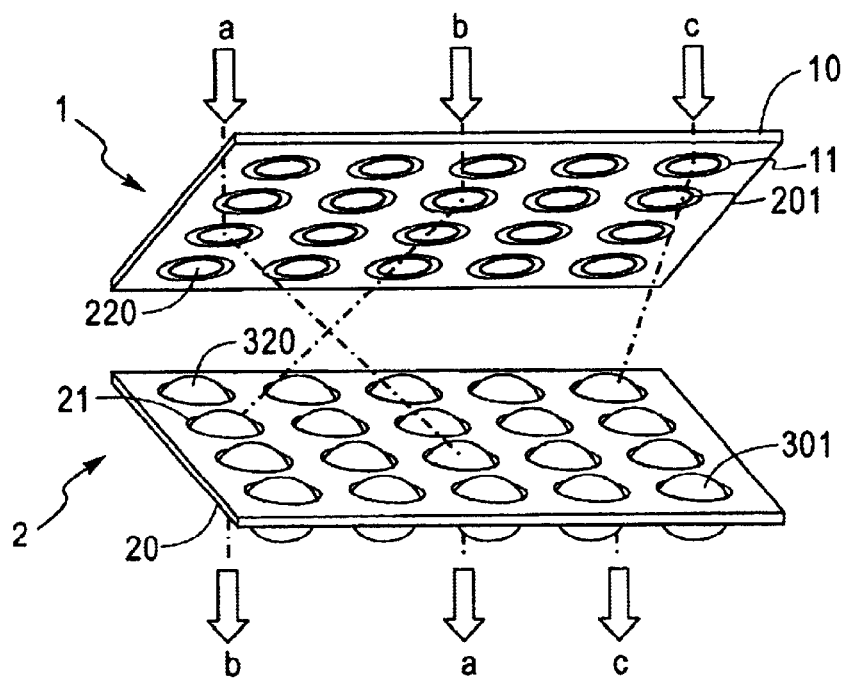
FIG. 3 is an exploded view between the two mounting plates of the device of FIG. 1.

Signals for the optimisation of a switching path may however also be provided from the receiving end of an optical transmission system (see the aforementioned Gibson reference, page 734, figure 54.3) comprising a device embodying the present invention between a first and a second optical fiber. After a switching path, such as switching path a—a shown in FIG. 3, is established, a transmitter may send a test signal over the first optical fiber 115, the established switching path in the device, and the second optical fiber 408 to an optical receiver which provides a feedback signal indicating the quality of the received signal. The control unit 500 in turn may then adjust the slideable optical element 215 until an optimal position is found.

The control unit 500 may receive signalling information required for the set-up of a switching path and the described feedback signals for example over a signal line CB through a telecommunications network such as the Integrated Services Digital Network ISDN.

In a particularly preferred embodiment of the present invention, the signals received from the light sensitive elements 70, which may be p-i-n or avalanche photo diodes for example, are used for bit sensing purposes. An intentional misalignment may be therefore permanently, or only from time to time, established. For the same purposes, the optical elements 301, 302 on the receiving side may act as beam splitters, which guide a small percentage of the optical signal to an optical receiver. Preferably, a narrow wavelength band in the lower or upper wavelength region is reserved for signalling purposes. The beam splitter is then designed in such a way that only optical signalling signals are deflected to the optical receiver. Optical receivers are described in the aforementioned Gibson reference, chapter 58, pages 789–793. Switching paths may therefore be established and terminated based on the sensed data transferred on a switching path or according to instructions sent over a separate telecommunication channel to the control unit 500. Bit sensing switching is further described in the aforementioned Gibson reference, chapter 37.2 on pages 515–518.

Figure 13:
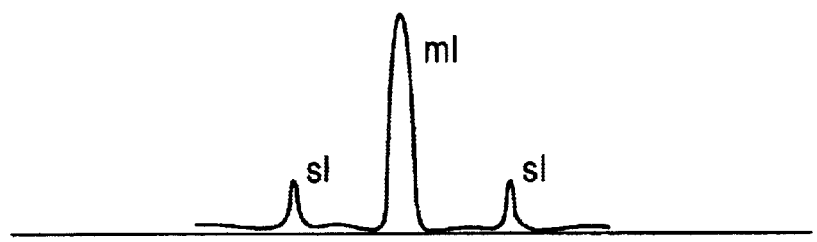
FIG. 13 shows a beam pattern of an optical signal generated by a slideable optical element(s).

For bit sensing purposes or for the adjustment of the light sensitive elements 70 as described above in conjunction with FIG. 2, a beam pattern of the optical signal as shown in FIG. 13 is preferably generated by the slideable optical elements 201, 202, . . . . The beam pattern of the optical signal comprises a main lobe ml and at least one side lobe sl which is directed towards a light sensitive element 70 for adjustment and/or bit sensing purposes.

FIG. 3 shows a view between the first and the second mounting plate 10, 20 of the device of FIG. 1 as well as three established switching paths a—a, b—b and c—c. The first mounting plate 10 carries twenty slideable optical elements 201, . . . , 220. The second mounting plate 20 carries twenty fixed optical elements 301, . . . , 320. Switching path a—a leads from optical element 215 on the first mounting plate 10 to optical element 308 on the second mounting plate 20. Switching path b—b leads from optical element 208 on the first mounting plate 10 to optical element 315 on the second mounting plate 20. Switching path c—c leads from optical element 201 on the first mounting plate 10 to optical element 316 on the second mounting plate 20. Switching paths can therefore be established in three dimensions between the optical elements 201, 202, . . . ; 301, 302, . . . of the first and the second mounting plate 10, 20.

Figure 4:
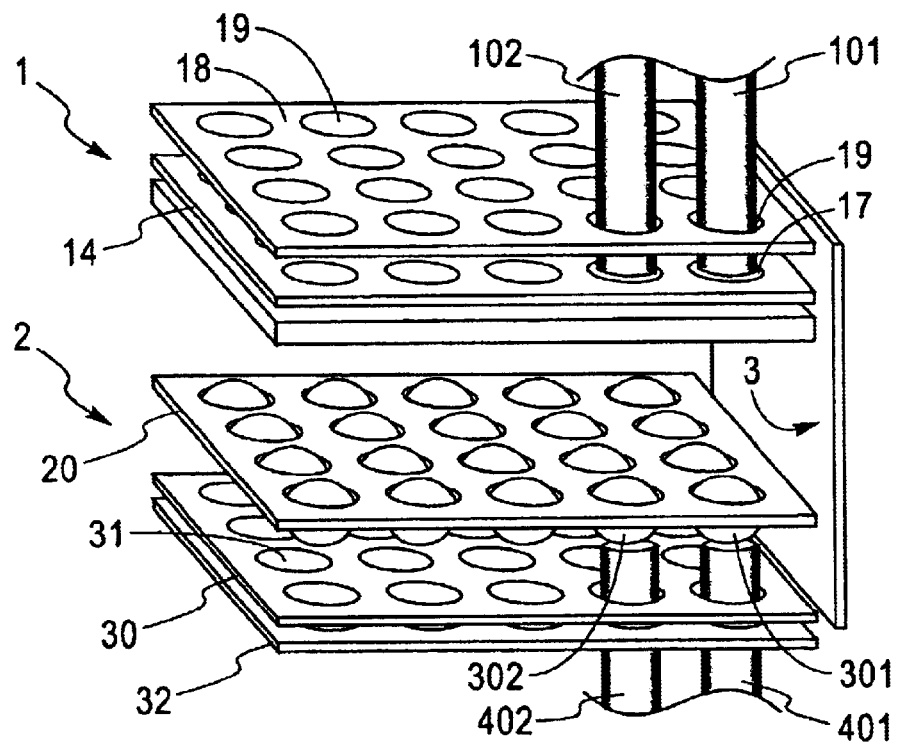
FIG. 4 is an exploded isometric view of an example of a device embodying the present invention having a layered structure.

FIG. 4 shows a device embodying the present invention having a layered structure with slideable optical elements 201, . . . , 220 enclosed between the first mounting plate 10 and the holding plate 14. Above the holding plate 14, a guiding plate 18 with conduits 19 for receiving and hold the first optical fibers 101, 102, . . . . Likewise, a holding plate 30 with conduits 31 and a guiding plate 32 are preferably arranged below the second mounting plate 20 in order to hold the optical elements 301, 302, . . . in place and to guide the optical fibers 401, 402, . . . . The aforementioned and further layers respective plates can easily be added during production. Alignment is practically not necessary since slight aberrations are automatically corrected during operation respective positioning of the slideable optical elements 201, 202, . . . .

The layered structure 1 containing mounting plate 10 and the layered structure 2 containing mounting plate 20 are connected by side walls or spacers 3 which may form a housing. The actuators 60, which may comprise several actuating elements 60a, 60b, 60c, 60d, . . . move the slideable optical elements 201, 202, . . . ; 3010, 3020, . . . with forces preferably generated by means of a piezoelectric, electrostatic, surface acoustic wave or thermal effect.

Figure 5:
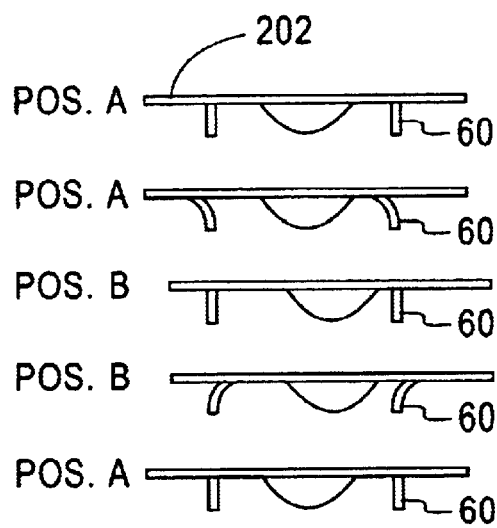
FIG. 5 shows a slideable optical element moved by actuating elements between positions A and B.
Figure 6:
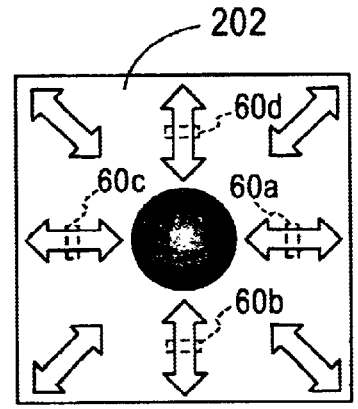
FIG. 6 is a plan view of the slideable optical element of FIG. 5.

Micromechanical structures (MEMS) are the basis of microactuators which are currently developed for the application in several technical fields, particularly for optical systems. Microactuators operating based on thermal effects are described in PCT patent application publication number WO 00/67063. Electrostatic microactuators are described in PCT patent application publication number WO 99/37013. Piezoelectric microactuators are described in U.S. Pat. No. 6,166,890. Microactuators operating based on the generation of surface acoustic waves are described in Japanese published patent application number JP 10-327590. As described in U.S. Pat. No. 6,166,890, piezoelectric microactuators may comprise a piezo crystal plane carrying beam like elements which under the influence of electrical fields are bent as shown in FIG. 5. If, for example, a saw tooth voltage is applied, the beam like elements quickly move in one direction thereby slipping under the slideable optical element 202 and slowly move backward thereby moving the slideable optical element 202. In order to move the slideable optical element 202, as shown in FIG. 6, in different directions within a plane preferably four beam like elements 60a, 60b, 60c and 60d of an actuator 60 are provided.

Elements of the actuators 60 may also be placed on both sides of the slideable optical element 201, 202, . . . . In a particularly preferred embodiment of the present invention, elements of the actuators 60 may be incorporated into the mounting plate 10. This further facilitates production.

It will be appreciated that, in preferred embodiments of the present invention, different fixed or slideable optical elements can be used.

Figure 7:
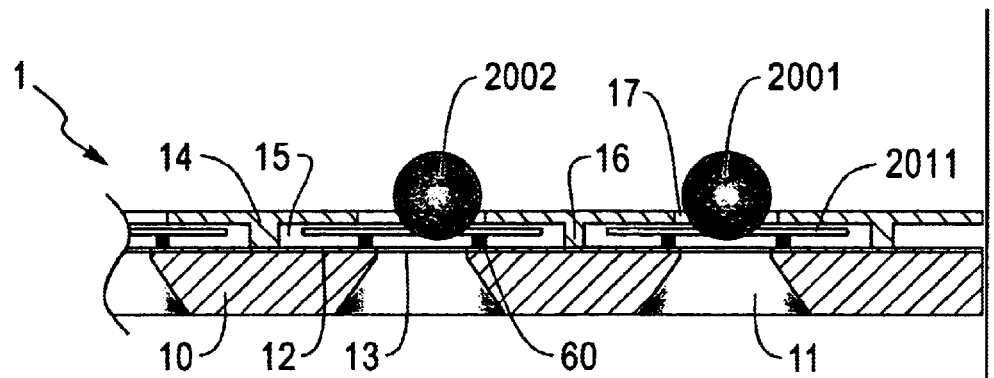
FIG. 7 is a side view of the first mounting plate equipped with slideable optical elements each comprising a ball lens.

FIG. 7 shows the first mounting plate 10 equipped with slideable optical elements 2001, 2002, . . . each comprising a ball lens carried on a slideable plate 2011.

Figure 8:
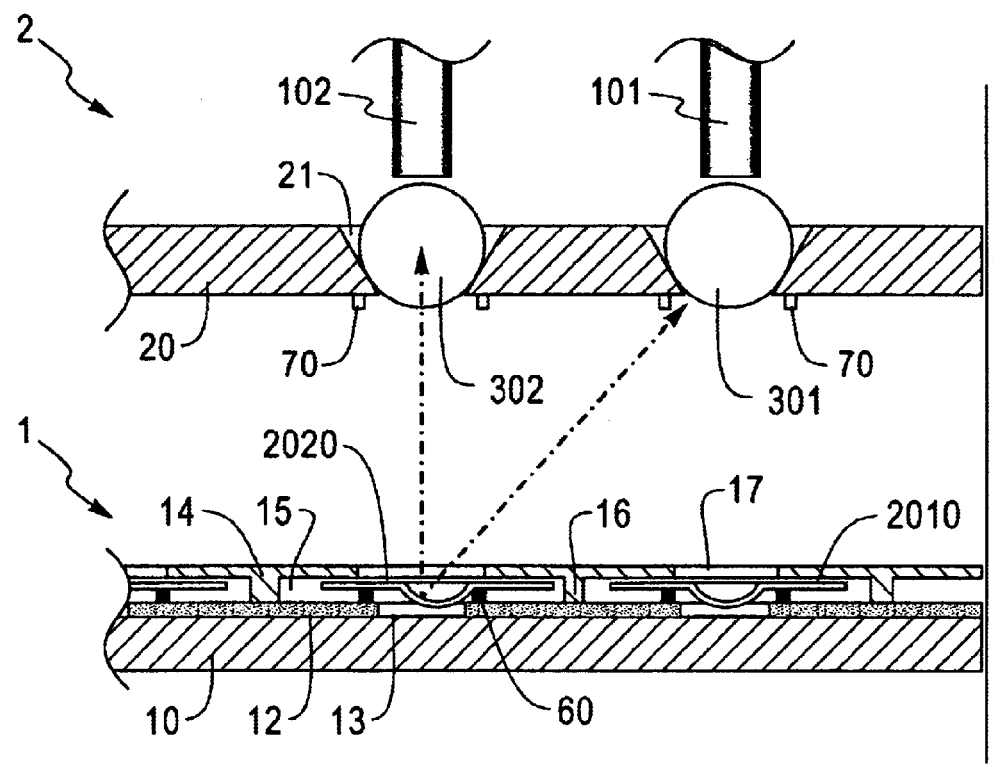
FIG. 8 is a side view of the first mounting plate equipped with slideable optical elements each comprising a mirror.

FIG. 8 shows the first mounting plate 10 equipped with slideable optical elements 2010, 2020, . . . comprising a mirror which is reflecting optical signals arriving from a first ball lens 301 to a second ball lens 302 which is installed in a conduit 21 of the second mounting plate 20.

Figure 9:
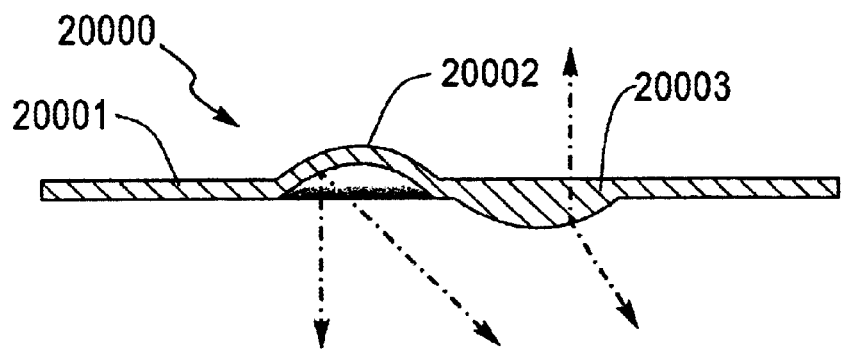
FIG. 9 is a side view of a slideable optical element which comprises a reflection part and a refraction part.
Figure 12:
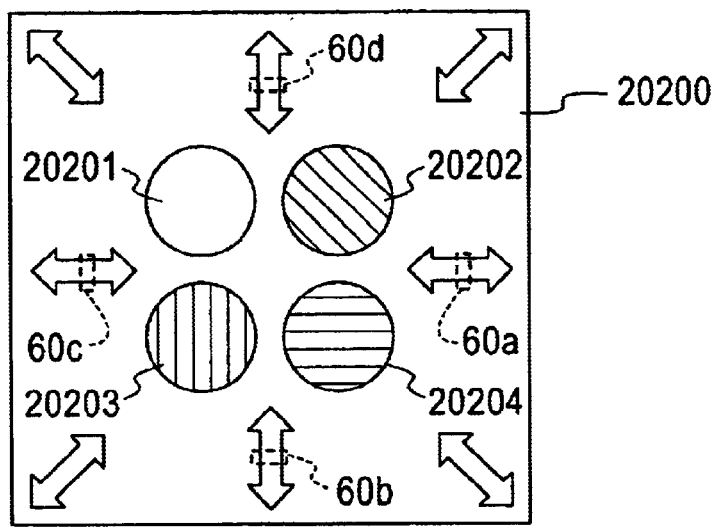
FIG. 12 is a plan view of an optical element comprising an array of gratings.

FIG. 9 shows a slideable optical element 20000 comprising a reflection part 20002 and a refraction part 20003 surrounded by flat ring 20001 designed to be carried on an actuator 60. As shown in FIG. 12 an optical element 20200 may comprise an array of gratings 20201, 20202, 20203, 20204 which are designed to deflect an incoming signal at a certain angle. In order to establish a selected optical path, the corresponding grating 20201; 20202; 20203; 20204 is aligned co-axially with the incoming fiber. Gratings comprising uniform structures and a size which is relatively large compared to the diameter of the incoming fiber can easily be switched, since no special alignment is required.

In order to reduce the size of devices embodying the present invention, fresnel lenses as described for example in European patent application publication number EP 1 039 325 A2 may advantageously be used as slideable optical elements.

Figure 10:
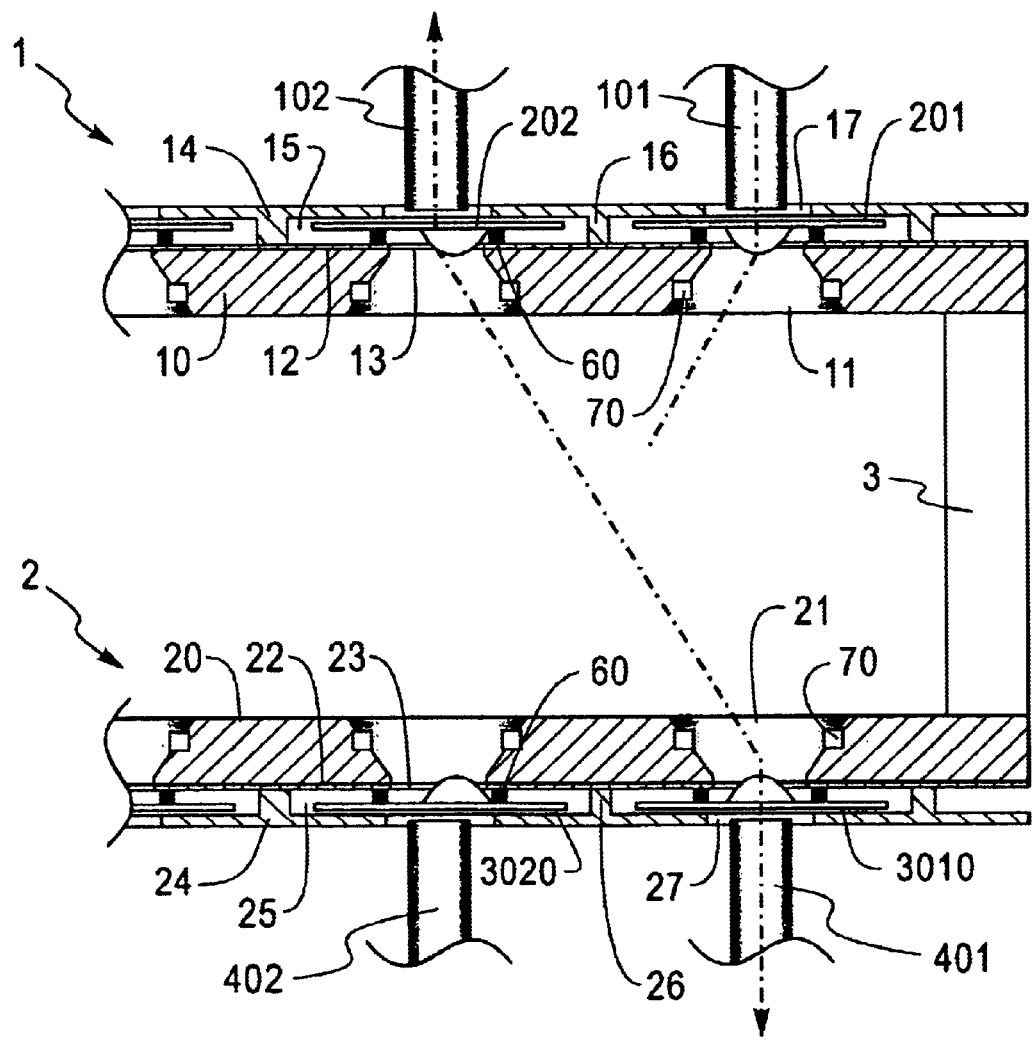
FIG. 10 is a side view of an example of a device embodying the present invention with slideable optical elements installed on both mounting plates.

As shown in FIG. 10 slideable optical elements 201, 202, . . . ; 3010, 3020 can be installed in the first and in the second mounting plate 10, 20 so that optical signals arriving over the first or the second optical fibers 101, 102, . . . ; 401, 402, . . . can be routed through the inventive device.

The optical elements may be gratings as described in the aforementioned Gibson reference, chapter 60.7, page 828. A diffraction grating is an optical element similar to a lens or a mirror superimposed with a precise pattern of microscopic periodic structures. Usually this pattern is a corrugated surface of grooves (a surface-relief grating). Other gratings however are formed by a periodic variation of the refractive index inside the grating itself. Gratings used to disperse ultraviolet (UV) and visible light usually contain between 300 and 3000 grooves per millimeter, so the distance between adjacent grooves is of the order of one micron. A reflection grating has its corrugated surface coated with a metal to enhance reflectivity. Transmission gratings do not have a metal coating; the incident light is diffracted upon transmission through the grating.

Figure 11:
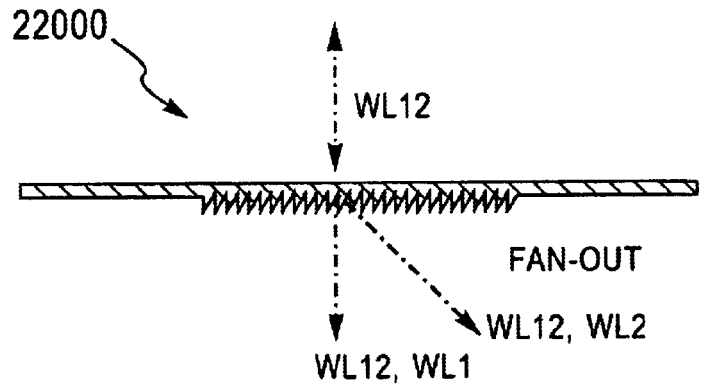
FIG. 11 is a side view of a diffraction grating.

A diffraction grating 22000, such as the one shown in FIG. 11, may preferably be designed to have a fan-out of several outgoing beams corresponding to an incident signal (see for example Saleh, Teich, FUNDAMENTALS OF PHOTONICS, A WILEY-INTERSCIENCE PUBLICATION, page 856). An optical signal of an incoming optical fiber may therefore be split into several optical signals which are forwarded to different outgoing optical fibers.

The diffraction grating 22000 may also divide respective demultiplex a wavelength multiplexed optical signal of the incoming optical fiber into signals of individual wavelengths which are forwarded to different outgoing optical fibers. In such a way a wavelength division multiplex (WDM) add drop multiplexer as described in the aforementioned Gibson reference, chapter 65.5, pages 888–889 can be created.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the present invention.

What is claimed is:

1. A device for directing an optical signal from a first optical fiber along one of a plurality of selectable switching paths each terminating in a corresponding one of a plurality of second optical fibers via an optical element, the optical element being moveable by a controllable actuator from a first to a second position to change the switching path of incident optical signal, wherein the optical element is slideably mounted in parallel to a first mounting plate comprising a conduit through which the optical signals from the first optical fiber can be directed by the optical element along the selected one of the switching paths to one of a plurality of conduits in a second mounting plate parallel to the first mounting plate, and further to the corresponding one of second optical fibers.

2. The device according to claim 1, wherein the first mounting plate comprises a plurality of conduits each for communicating optical signals with a corresponding one of a plurality of first optical fibers and each corresponding to a different one of a plurality of optical elements slideably mounted in parallel to the first mounting plate for selectively directing optical signals passing through the corresponding conduit.

3. The device according to claim 2, in which optical elements are mounted in parallel to the second mounting plate for adapting an optical signal arriving over the switching path to the second optical fibers.

4. The device according to claim 3, wherein the optical elements mounted in parallel to the second mounting plate are slideably moveable relative to the conduits in the second mounting plate for directing optical signals arriving from the second optical fibers to the optical elements of the first mounting plate and further to the first optical fibers.

5. The device according to claim 1, wherein each of the slideable optical elements is coupled to an actuator subsystem for sliding the optical elements between different positions within a plane.

6. The device according to claim 5, wherein the actuator subsystem move the slideable optical elements based on forces generated by any one or more of piezoelectric, electrostatic, acoustic, and thermal effects.

7. The device according to claim 5, wherein the actuator subsystem is adapted to hold the slideable optical elements in position by friction.

8. The device according to claim 5, wherein each slideable optical element comprises a flat part which is supported by the actuator subsystem and at least one of a reflective part and a refractive part.

9. The device according to claim 8, wherein the reflective part comprises a mirror and wherein the refractive part comprises a lens.

10. The device according to claim 5, wherein the actuator subsystem and light sensitive elements, are arranged near the conduits of at least one of the first and the second mounting plate, and are connected to a control unit which adjusts the position of the slideable optical elements such that signals caused in the light sensitive elements by improper alignment of optical signals are reduced to a minimum.

11. The device according to claim 10, wherein two or more light sensitive elements are placed at regular distances on a circle concentric to a conduit.

12. The device according to claim 10, wherein the slideable optical elements are designed to provide optical signals with a main lobe and at least one side lobe which is directed toward a light sensitive element.

13. The device according to claim 10, wherein the control unit senses data carried by the signals received from the light sensitive elements.

14. The device according to claim 1, wherein the slideable optical elements are designed to have a fan-out of at least two optical beams which are guided along different switching paths.

15. The device according to claim 1, wherein the slideable optical elements are mounted between the corresponding mounting plate and a holding plate comprising apertures for the passage of optical signals.

16. The device according to claim 1, wherein the first and second mounting plates are connected to each other by spacers or side-walls.

17. A method for directing an optical signal from a first optical fiber along one of a plurality of selectable switching paths each terminating in a corresponding one of a plurality of second optical fibers via an optical element, the optical element being moveable by a controllable actuator from a first to a second position to change the switching path of incident optical signal, wherein the method comprises: slideably mounting an optical element in parallel to a first mounting plate comprising a conduit; and directing the optical signals from the first optical fiber through the conduit by the optical element along the selected one of the switching paths to one of a plurality of conduits in a second mounting plate parallel to the first mounting plate, and further to the corresponding one of second optical fibers.

* * * * *